United States Patent [19]

Ittipiboon et al.

[11] Patent Number: 5,303,419
[45] Date of Patent: Apr. 12, 1994

[54] APERTURE-COUPLED MICROSTRIP LINE MAGIC-TEE AND MIXER FORMED THEREFROM

[75] Inventors: Apisak Ittipiboon, Kanata; Michel Cuhaci, Ottawa; Masahiro W. Katsube; Yahia M. M. Antar, both of Kingston, all of Canada

[73] Assignee: Her Majesty the Queen in Right of Canada as represented by the Minister of Communications, Ottawa, Canada

[21] Appl. No.: 890,262

[22] Filed: May 29, 1992

[51] Int. Cl.$^5$ .......................... H04B 1/28; H01P 5/20
[52] U.S. Cl. .................................. 455/327; 455/330; 455/333; 333/121; 333/246
[58] Field of Search ............. 333/121, 123, 136, 117, 333/246; 455/326, 327, 330, 333

[56] References Cited

U.S. PATENT DOCUMENTS

| | | | |
|---|---|---|---|
| 3,611,153 | 10/1971 | Wen | 455/327 |
| 3,771,075 | 11/1973 | Phelan | 333/246 |
| 3,946,339 | 3/1976 | Oltman, Jr. et al. | 333/121 |
| 4,377,005 | 3/1983 | Marchand et al. | 455/327 |
| 4,952,895 | 8/1990 | Quan | 333/121 |
| 5,063,365 | 11/1991 | Cappucci | 333/121 |
| 5,075,647 | 12/1991 | Petter | 333/121 |
| 5,093,639 | 3/1992 | Franchi et al. | 333/246 X |

OTHER PUBLICATIONS

*Full-Wave Analysis of Aperture-Coupled Microstrip Lines*, Naftali Herscovivi and David M. Pozar, IEEE Transactions on Microwave Theory and Techniques, vol. 39, No. 7, Jul. 1991.

*Analysis of Slot-Coupled Double Layer Microstrip Lines*, A. Ittipiboon, D. Roscoe and M. Cuhaci, ANTEM '90.

*Couplings Between Two Microstrip Lines Through Apertures*, Mahesh Kumar, Electronics Letters 6th Jul. 1978, vol. 14, No. 14.

*Slot-Coupled Directional Couplers Between Double-Sided Substrate Microstrip Lines and Their Applications*, Toshiaki Tanaka, Kikuo Tsunoda and Masayoshi Aikawa, IEEE Transactions on Microwave Theory and Techniques vol. 36, No. 12, Dec. 1988.

*Primary Examiner*—Benny T. Lee
*Attorney, Agent, or Firm*—Thomas Adams

[57] ABSTRACT

In order to reduce size and facilitate incorporation into planar multi-layer microwave integrated circuits, a microwave hybrid, specifically a Magic-Tee, is formed using microstrip circuit elements and aperture coupling. The Magic-Tee comprises a ground plane interposed between dielectric printed circuit boards. The outermost surface of one of the boards carries a Tee circuit comprising microstrip branch arm conductors with a microstrip conductor projecting transversely from its middle, the Tee junction, to form the leg of the Tee. The outermost surface of the other board comprises a line in the form of a microstrip conductor. An aperture is provided in the ground plane at a position between the Tee junction and an underlying part of the line conductor. Various Tee junction configurations, such as Y or Δ, may be implemented also. The magic Tee may be an integral part of an MIC or MMIC device.

16 Claims, 4 Drawing Sheets

APERTURE-COUPLED MICROSTRIP LINE MAGIC-TEE AND MIXER FORMED THEREFROM

FIELD OF THE INVENTION

This invention relates to microwave hybrid devices, especially Magic-Tee couplers. Embodiments of the invention are especially suitable for use in radar and communications systems.

BACKGROUND

As radar systems and communication systems become more compact, there is a need for circuit elements which can be integrated in multi-level circuits. A Magic-Tee which can be integrated into planar multilevel circuits, for example microwave integrated circuits for feeding phased array antennas is particularly desirable. As is generally known, the Magic-Tee is a four port device in which (i) a signal applied at the leg of the Tee will be divided between the branch arms of the Tee, usually with equal amplitude and in-phase. The feedline is isolated; (ii) a signal applied to the feedline will be divided between the branch arms of the Tee with equal amplitude and 180° out-of-phase, with the Tee leg isolated; (iii) if first and second signals are applied to the branch arms, respectively, their sum will appear at the Tee leg and their difference at the feedline; (iv) the Tee leg and the feedline are mutually isolated.

The operational band of such a Magic-Tee is the range of frequencies over which it will display these characteristics within acceptable limits. Operational bands of Magic-Tee couplers vary according to their construction. Devices implemented using waveguide technology are bulky and have a relatively narrow band width. Other Magic-Tee implementations include stripline asymmetrical couplers, which do not have good phase tracking over a wide frequency band, and microstrip-slotline configurations wherein the respective boards are not shielded from each other.

Striplines comprise a conductor between two ground planes, whereas microstrip lines comprise a conductor adjacent a single ground plane. Also, striplines and microstrip lines use different modes of propagation.

U.S. Pat. No. 5,063,365 (Capucci), which is incorporated herein by reference, discloses a Magic-Tee implemented as a stripline quadrature complex with a 90° line.

U.S. Pat. No. 4,952,895 (Quan), which is incorporated herein by reference, discloses a Magic-Tee which comprises a combination of stripline and double-sided airstripline circuits formed on two dielectric boards sandwiched together. The Magic-Tee devices disclosed by Capucci and Quan have the disadvantage of non-symmetrical operation and limited performance over a wide bandwidth. The stripline structure is not readily integrable with Monolithic Microwave Integrated Circuits and relatively complex.

U.S. Pat. No. 5,075,647 (Petter) discloses a symmetrical 180° microwave hybrid constructed by opening a slot line in a ground plane below a conductive strip disposed on a dielectric substrate, creating a slot-coupled conductor. In essence, Petter's device is a microstrip line—slot line—microstrip line coupler and hence uses two different modes of propagation, which is complicated. Petter's device requires proper impedance matching in two different propagating media to maximize energy coupling to the microstrip, which leads to increased size and complexity.

There remains a need, therefore, for a microwave hybrid device, especially a Magic-Tee, which is capable of wide band operation with relatively low loss, easy to construct, and suitable for use with Monolithic Microwave Integrated Circuits.

SUMMARY OF THE INVENTION

The present invention seeks to eliminate, or at least mitigate, the disadvantages of the prior art and to provide a new microwave hybrid device, particularly a Magic-Tee, suitable for integration in planar multilevel microwave circuits, for example Microwave Integrated Circuits (MIC).

To this end, the present invention proposes to implement a Magic-Tee by employing aperture-coupling between a microstrip Tee element and a microstrip feedline.

The general principles of aperture coupling between microstrip lines have been discussed in the literature since at least as early as 1978, when an article entitled "Coupling Between Two Microstrip Lines Through Apertures" by Mahesh Kumar was published in Electronics Letters, Jul. 6, 1978, Vol. 14, No 14. Kumar disclosed a common ground plane sandwiched between a pair of substrates. Aligned microstrip lines on the outer surfaces of the substrates were coupled by way of a narrow transverse slot. More recently, a slot-coupled microstrip directional coupler was disclosed by Toshiaki Tanaka et al in a paper entitled "Slot-Coupled Directional Couplers Between Double-Sided Substrate Microstrip Lines and Their Applications", IEEE Transactions on Microwave Theory and Techniques, Vol. 36, No. 12, December 1988. Tanaka et al disclosed a slotted ground plane sandwiched between two substrates with microstrip lines on respective outer substrate surfaces. The microstrip lines were broadened in the region of the slot, which was approximately the same width as the broadened portions. Directional coupling was achieved using even- and odd-mode electric fields.

An analysis of aperture-coupled microstrip lines was disclosed by Naftali Herscovici and David M. Pozar in an article entitled "Full-Wave Analysis of Aperture-Coupled Microstrip Lines", IEEE Transactions on Microwave Theory and Techniques, Vol. 39, No. 7, July 1991. An alternative, perhaps simpler, form of analysis using Poynting vectors and modal analysis was disclosed by A. Ittipiboon et al in an article "Analysis of Slot-Coupled Double Layer Microstrip Lines", ANTEM '90, pp. 454–459.

All four of the foregoing articles are incorporated herein by reference.

The aperture-coupling disclosed in the foregoing disclosures is relatively simple compared with the asymmetrical coupling requirements of a Magic-Tee itemized as (i) to (iv) supra.

According to one aspect of the present invention, there is provided a microwave Magic-Tee circuit arrangement comprising a sandwich formed by a conductive ground plane layer and two dielectric layers, each dielectric layer having an innermost surface and an outermost surface, a microstrip Tee circuit element on the outermost surface of one dielectric layer and a microstrip feedline conductor on the outermost surface of the other dielectric layer, the microstrip Tee circuit element comprising first and second branch arm conductors, respectively, joined together at a Tee junction and a Tee leg conductor extending from the Tee junction, the Tee leg being symmetrical about its longitudinal axis, and an aperture through said ground plane layer between the Tee junction and an underlying part of the feedline conductor, the Tee junction, the aperture and the part of the feedline conductor being aligned in a direction perpendicular to the layer, the aperture having an axis of symmetry aligned with said longitudinal axis of the Tee leg, respective longitudinal axes of the Tee branch arms, Tee leg and feedline conductor and the axis of symmetry of the aperture intersecting centrally of said aperture.

In preferred embodiments of the invention, the branch arms are collinear. Preferably, the aperture is oblong, specifically rectangular in shape, and extends orthogonally relative to the branch arms.

Advantageously, the aperture is configured to provide an aperture field substantially confined to the width of the Tee leg conductor.

Preferably, the feedline conductor is reflectively terminated i.e. not terminated in its characteristic impedance. Advantageously, one end of the feedline conductor terminates in an open-circuit about one quarter wavelength distance from the longitudinal axis of the Tee leg.

At least one of the branch arms may have an extension offset laterally relative to a corresponding extension of the feedline. Such offset extensions permit connections to be made when the device is a discrete component. The device may be integrated into a multi-level planar microwave integrated circuit, or a monolithic microwave integrated circuit, (MMIC), in which case, the offset extensions will not be needed. Instead the branch arms and feedline will be connected directly to the respective conductors of the integrated circuit.

BRIEF DESCRIPTION OF DRAWINGS

Further features and advantages of the present invention will become apparent from the following description of embodiments of the invention which are described, by way of example only, with reference to the accompanying drawings, in which.

DESCRIPTION OF PREFERRED EMBODIMENTS

Figure 1:
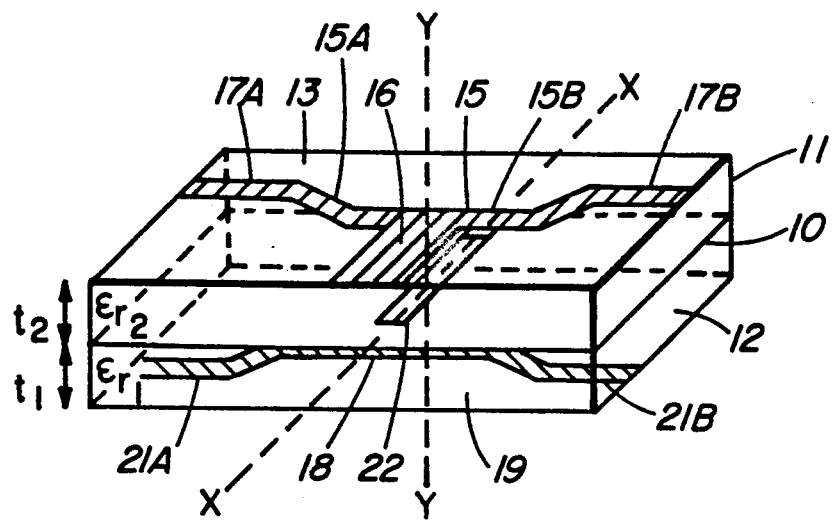
FIG. 1 is a perspective view of a discrete aperture-coupled microstrip Magic-Tee device.
Figure 2:
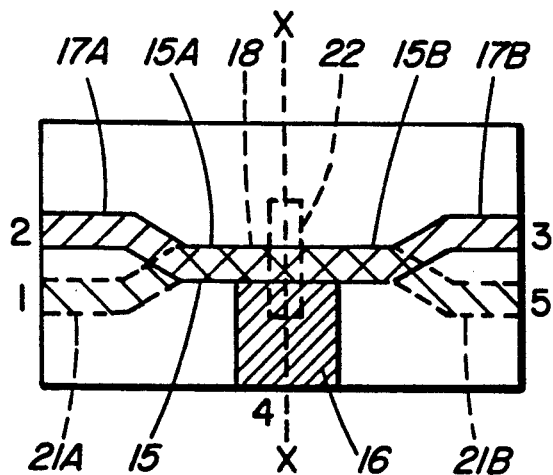
FIG. 2 is a plan view of the microstrip Magic-Tee device of FIG. 1.

In the various Figures, the same reference numbers are used for the same or corresponding elements. Referring to FIGS. 1 and 2, a microwave hybrid circuit in the form of a Magic-Tee comprises a ground plane 10 sandwiched between two dielectric circuit boards 11 and 12 having thicknesses and relative permittivities $t_2/\epsilon_{r2}$ and $t_1/\epsilon_{r1}$, respectively. Opposed innermost surfaces of the dielectric circuit boards 11 and 12 are in contact with respective opposite sides of the ground plane 10. The other surface 13 of dielectric board 11 (shown uppermost in FIG. 1) carries a printed microstrip Tee, its branch arms 15A and 15B formed by a microstrip printed circuit conductor 15 extending along its length and its leg 16 formed by a microstrip printed circuit conductor extending orthogonally from the medial portion of conductor 15, where the branch arms 15A/15B are joined together, to the edge of dielectric circuit board 11. The conductor 15 has extensions 17A and 17B extending from its opposite ends. The extensions 17A and 17B are offset laterally relative to the conductor 15 to facilitate connection of the Tee to other circuitry.

Figure 3:
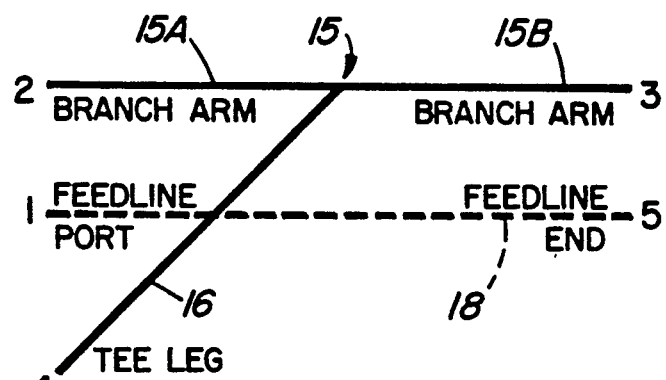
FIG. 3 shows the port designations of the Magic-Tee.

A feedline in the form of a second microstrip printed circuit conductor 18 is provided on the outermost surface 19 of the dielectric circuit board 12. The second printed microstrip circuit conductor 18 has offset end extensions 21A and 21B similar to those of the Tee but offset in the opposite direction. In FIGS. 1 and 3, the respective conductors 15 and 18 are cross-hatched differently. The Tee branch arms 15A and 15B are aligned with the feedline 18 along an axis Z—Z. (FIG. 2)

The extensions, 17A, 17B and 21A, 21B merely serve to facilitate connection of the Magic-Tee to other components. This is useful when the Magic-Tee is a discrete component. It should be appreciated, however, that the Magic-Tee itself is formed by the branch arms 15A, 15B, Tee leg 16, feedline 18 and aperture 22. These components may be integrated directly into an integrated microwave circuit structure without any need for the offset extensions 17A/17B or 21A/21B, as will be described later with reference to FIG. 11.

An elongate, narrow rectangular aperture 22 is provided in the ground plane 10. The aperture 22 extends with its longitudinal axis aligned with the longitudinal axis X—X of the leg 16 of the Tee. The length of the aperture 22 is such that it extends beyond, and an equal distance on either side of, the aligned conductors 15 and feedline 18. The aperture 22 and Tee leg 16 are symmetrical about their respective longitudinal axes. Thus, the longitudinal axes of the branch arm conductors 15, Tee leg 16 and feedline 18 intersect the longitudinal axis of the aperture 22 at the middle of the aperture 22.

FIGS. 3, 4 6, 7 and 8 shows the port designations 1, 2, 3, 4 and 5 of the Magic-Tee. Ports 1 and 5 are the respective ends of the feedline conductor 18, ports 2 and 3 are ends of the branch arms 15A and 15B, respectively, and port 4 is the leg 16 of the Tee. The feedline 18 may be extended and port 5 connected to external circuitry, in which case the device will provide both Magic-Tee coupling and coupling to other circuitry.

In practice, port 5 will usually not be coupled to other circuitry but will be properly terminated so that the device exhibits the required Magic-Tee characteristics more effectively. This entails open-circuit or short-circuit termination of the feedline port 5 at a distance from the aperture 22 which is approximately a multiple of $\pi/4$, where $\pi$ is the guided wavelength of the applied signal. It was found that optimum efficiency and broadest bandwidth were obtained with the feedline 18 terminated in an open-circuit, as indicated at 23 in FIG. 4, at a distance d which is nominally one quarter wavelength beyond the longitudinal axis of aperture 22. In practice, the actual distance d will be adjusted experimentally to optimize energy transfer and input matching.

Figure 4:
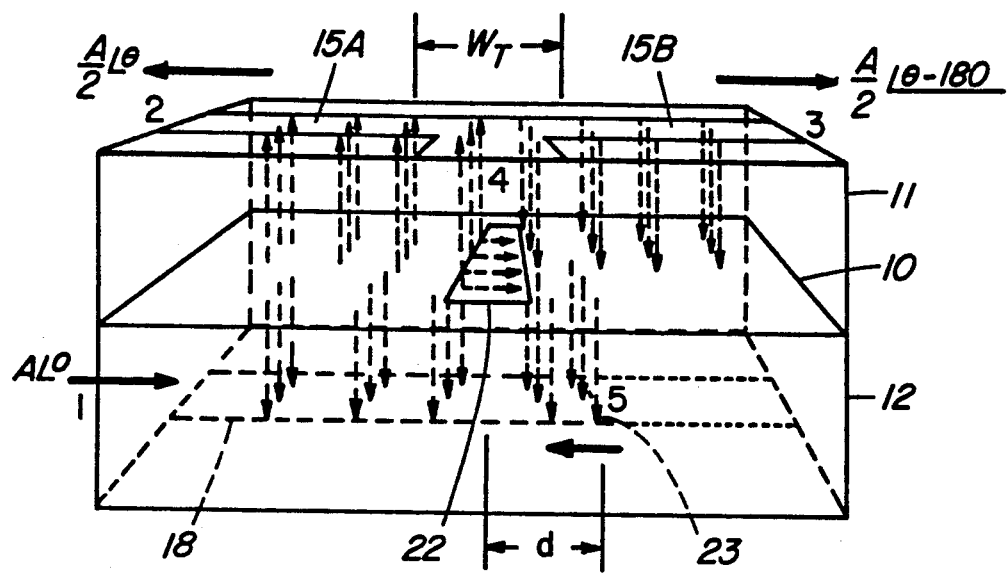
FIG. 4 illustrates an alternative embodiment with a foreshortened feedline conductor, and shows signal flow and electric field distribution for signals applied to the feedline conductor.

As shown in FIG. 4, a signal $A<0$ applied to port 1 is coupled through the aperture 22 to ports 2 and 3 of branch arms 15A and 15B, respectively, with signals $A/2<\theta$ and $A/2<\theta-180°$ equal in magnitude but 180° out-of-phase. In the case illustrated in FIG. 4, current in the feedline 18 induces currents in the ground plane 10 which are cut by the aperture 22. Hence, a field is generated across the aperture 22 and couples with the arms 15A and 15B of the Tee.

Figure 5:
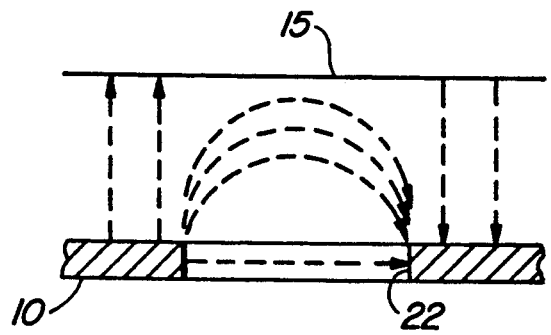
FIG. 5 is a detail view showing the field distribution in the vicinity of the aperture for the feed arrangement of FIG. 4.

FIG. 5 shows in more detail the field generated in the vicinity of the aperture 22 and how it induces opposed signals in the branch arms of the Tee. Because the field lines either side of the aperture 22 are in opposite directions, any voltages induced in the leg 16 will cancel, so there will be no signal at port 4 (FIG. 4).

Figure 6:
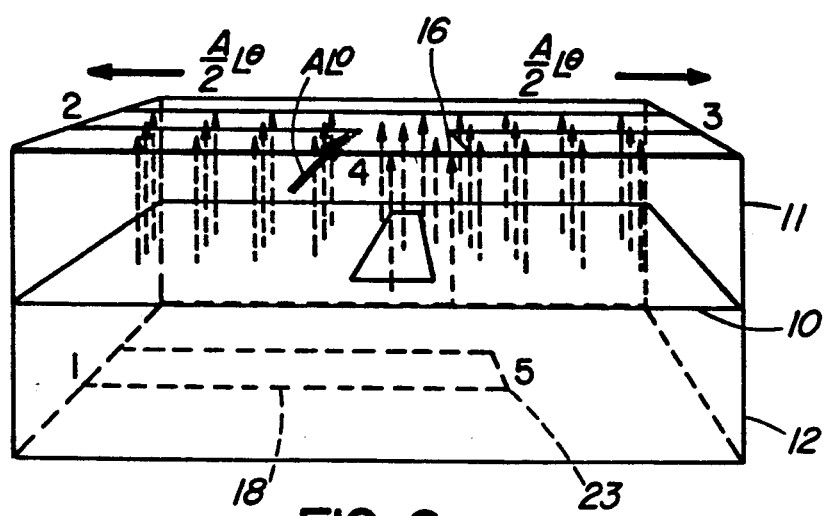
FIG. 6 illustrates signal flow and field distribution for signals applied to the leg of the Tee.

As shown in FIG. 6, a signal $A<0$ applied at port 4, the leg 16 of the Tee, divides equally between ports 2 and 3 giving signals $A/2<\theta$ equal in amplitude and phase.

There is high isolation between ports 1 and 4. Only an insignificant amount of the input signal power (crosstalk) is coupled through the aperture 22 to the feedline 18.

Figure 7:
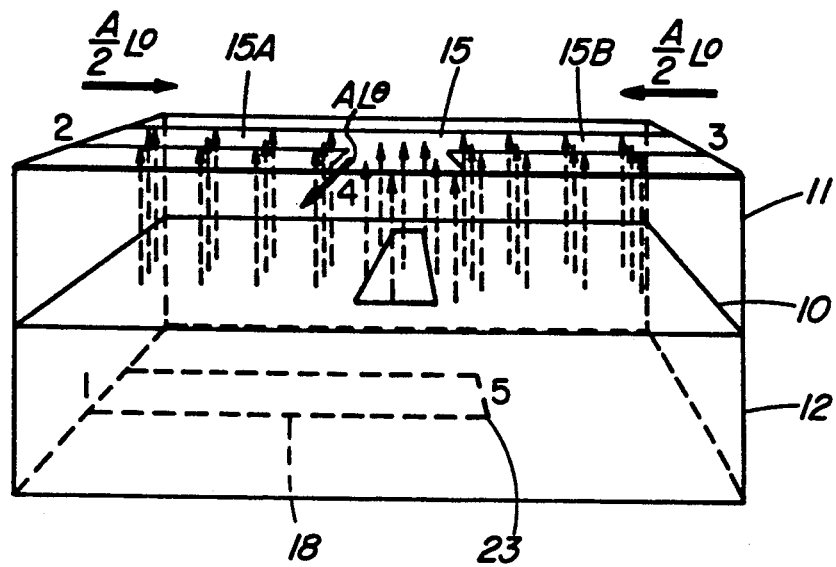
FIG. 7 illustrates signal flow and field distribution for identical signals applied to the branch arms of the Tee.

Conversely, as shown in FIG. 7, when equal, in-phase signals $A/2<0$ are applied to ports 2 and 3, their sum, $A<\theta$ is provided at port 4 with no significant coupling to the feedline 18 (port 1).

Figure 8:
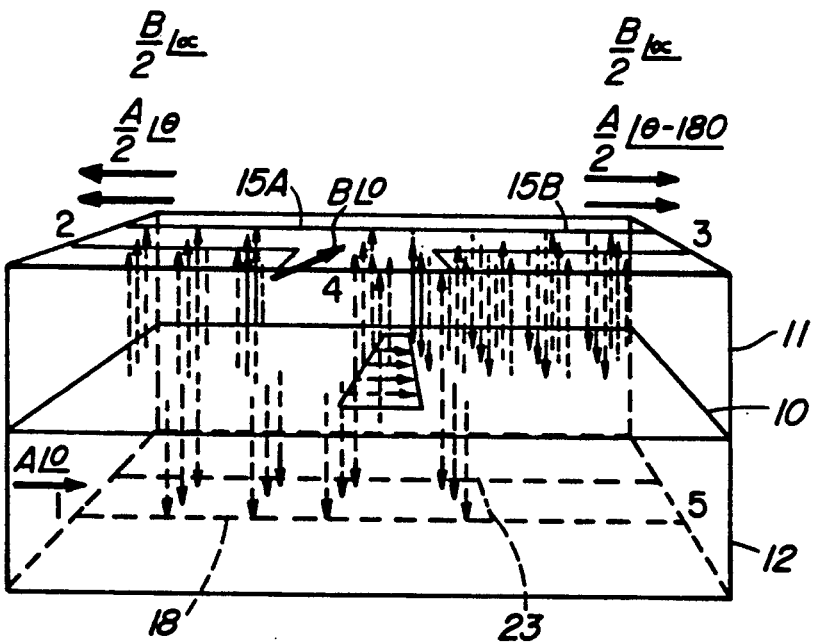
FIG. 8 illustrates a general case of signal flow and field distribution when signals are applied to the feedline and the leg of the Tee simultaneously.

As illustrated in FIG. 8, it is possible to feed both port 1 and port 4 simultaneously with signals $A<0$ and $B<0$, respectively, to give signals $A/2<\theta+B/2<\alpha$ and $A/2<\theta-180+B/2<\alpha$ at ports 2 and 3, respectively, with feedline 18 terminated at open-circuit at 23. Such a feed arrangement might be employed in a mixer, as will be described later with reference to FIG. 11, with a local oscillator signal applied to port 1 and a radio frequency signal applied to port 4.

Feedline 18 may be extended, in which case a signal $A/m<\phi$ will be provided at port 5. The signals at ports 2 and 3 will be reduced correspondingly.

The required Magic-Tee characteristics are obtained and optimised by proper design of the circuitry, optimisation of the aperture dimensions based on developed theory, and careful consideration of the phase relations of RF signals at the various ports.

For the device to meet the operational requirements, the dimensions of the aperture 22, microstrip conductors 15 and 18, leg 16, dielectric thickness and relative permittivity of layers 11 and 12, and terminations have to be determined for the required operational bandwidths. The Magic-Tee must be symmetrical about the plane formed by the intersection of the X—X and Y—Y axes shown in FIG. 1.

Referring again to FIG. 4, as a result of the orthogonal property of the leg of the Tee (port 4), and the unidirectional Z-axis field at the aperture 22, the feedline 18 and port 4 are isolated. Hence, as a first order approximation, the analysis of the Magic-Tee can deal independently with (i) the Tee junction at the top, and (ii) the coupling through the aperture 22 from the feedline 18 to the branch arms 15A/15B.

Details of Tee-junction analysis can be found in microwave engineering text books. In order to determine the S-parameters of the junctions of Magic-Tee devices according to the present invention, the inventors used a modal analysis technique based on Lorentz reciprocity and Poynting theorems as described in the article "Analysis of Slot-Coupled Double Layer Microstrip Lines" ANTEM '90 pp. 454–459 by A. Ittipiboon, D. Roscoe and M. Cuhaci, supra.

The parameters of interest are:

1. Coupling through the aperture from the feedline to ports 2 (S21) and 3 (S31). (Outputs at ports 2 and 3 should be equal in magnitude but 180° out of phase).

2. Degree of isolation (S41) of port 4 from the feedline (port 1).

3. Power division and phase relations at ports 2 (S24) and 3 (S34) resulting from input at port 4. (Ideally power input at port 4 should divide equally in magnitude and in phase between ports 2 and 3).

It will be appreciated that, as the width of the aperture increases, the stray coupling through the aperture to the feedline 18 will increase. At the same time, the narrower the aperture 22, the more difficult it will be to generate adequate coupling from the feedline 18 through the aperture 22 to the branch arms 15A/15B. In practice, it will usually be necessary to experiment to determine the optimum proportions. Coupling curves were generated from computations based on modal analysis to determine dimensions of aperture 22 (primarily the length) for optimum coupling in a certain frequency range. A number of prototypes were built and tested with variations in aperture, Tee-branch and feedline dimensions, with a view to optimizing the aperture coupling without distorting the phase relations, and to produce equal power division in the branch arms. Also high isolation between the feedline 18 and port 4 line (Tee-branch) was sought while minimizing power reflected from all ports.

As expected, good results were obtained with narrow apertures (Width<0.635 mm.), since with wider apertures the field structure at the aperture changes and coupling occurs from the feedline 18 to the Tee leg port 4. Also, phase distortion increases at ports 2 and 3. Using Rogers Corporation RT/Duroid 6010 (Trade Mark) soft substrate for the dielectric layers, best results were realised with the following dimensions:

Relative permittivity of dielectric layers 11 and 12: $\epsilon r1 = \epsilon r2 = 10.2$.

Thickness of dielectrics 11 and 12: $t1=t2=0.635$ mm.

Width of Tee branch conductor 15=width of feedline 18 =0.7 mm.

Width $W_T$ of Tee leg 16 (port 4)=1.9 mm.

Aperture 22 length=3.6 mm.

Aperture 22 width=0.6 mm.

For an input signal at port 1, such a configuration produced, at ports 2 and 3. (S31−S21), an amplitude imbalance of ±0.2 dB and phase tracking of 170°±10° for frequencies in the range 12.0 GHz to 19.0 GHz. Power transfer through the aperture 22 was maximized in the operating range with the feedline port 5 terminated open-circuit at a distance of about 0.97 mm. measured from the longitudinal axis of the aperture. Isolation (S41) between ports 1 and 4 was better than 25 dB over the same frequency range.

Generally the width of the aperture 22 should be kept as narrow as possible to provide high isolation. Its length should preferably be determined so as to avoid resonance at operating frequencies. Reflection at the 15.5 Ghz centre frequency was better than −20 dB. Phase error was measured as less than 20° within the operating frequency range, caused primarily by the coaxial connections to the device.

Figure 9:
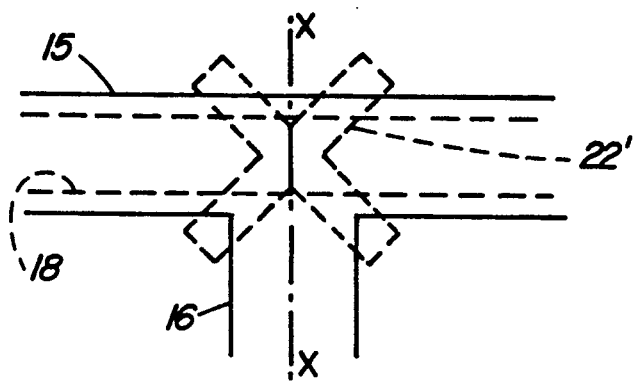
FIG. 9 illustrates an alternative aperture shape.

Various modifications are possible without departing from the scope of the present invention. Thus, the shape of the aperture 22 need not be rectangular. So long as it provides a field pattern which is symmetrical about the longitudinal axis of the Tee leg, and resultant field substantially confined to the width of the Tee leg 16, various shapes may be employed. FIG. 9 shows, for example, a cruciform aperture 22' with its arms disposed obliquely to the longitudinal axis XX of the Tee leg 16. The arms of the cruciform aperture extend beyond, and either side of, the conductors 15 and 18. Field cancellation leaves a resultant 0 field along the axis of symmetry.

Figure 10A:
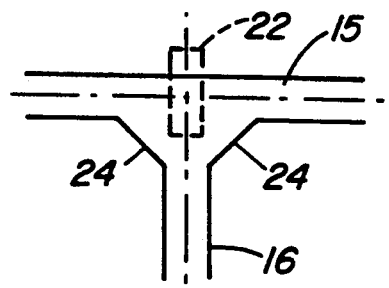
FIGS. 10($a$) to 10($d$) illustrate modifications to the shape of the Tee element in the region of the Tee junction.
Figure 10B:
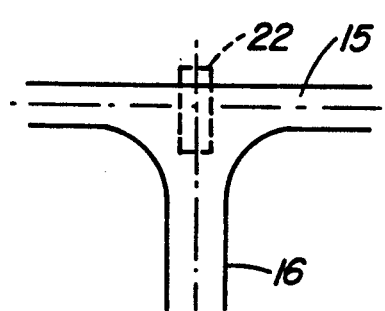
Figure 10C:
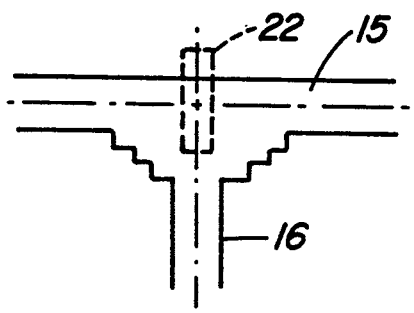
Figure 10D:
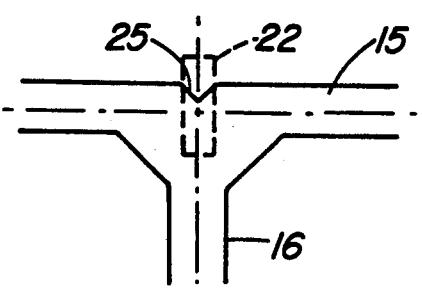

FIGS. 10(a) to 10(d) illustrate modifications to the shape of the Tee in the region of the Tee junction. FIG. 10(a) shows oblique corners 24 forming a generally triangular Tee junction. FIG. 10(b) has the Tee junction edges progressively tapered or curved, while FIG. 10(c) shows the Tee junction corners stepped. In any of these cases, the opposite edge of the conductor 15 may be notched as indicated at 25 in FIG. 10(d). In all cases, the Tee junction, corner formations and/or notches preferably are symmetrical about the longitudinal axis of the Tee leg 16 and hence about the major axis of the aperture 22.

It should be noted that the feedline 18 need not be aligned with the branch arms 15A/15B of the Tee. Providing the longitudinal axis of feedline 18 intersects the perpendicular through the longitudinal axes of the branch arms 15A/15B, leg 16 and aperture 22, respectively, and the aperture 22 extends beyond the edges of the feedline, the feedline may run at an angle to the branch arms of the Tee.

It should be appreciated that the dielectric layers 11 and 12 need not have the same relative permittivity and thickness. Likewise, the branch arms 15A/15B need not be the same width as the feedline 18.

The described embodiment is only one of many possible embodiments of the present invention which may embody the principles of aperture coupling and MIC or MMIC technology.

Figure 11:
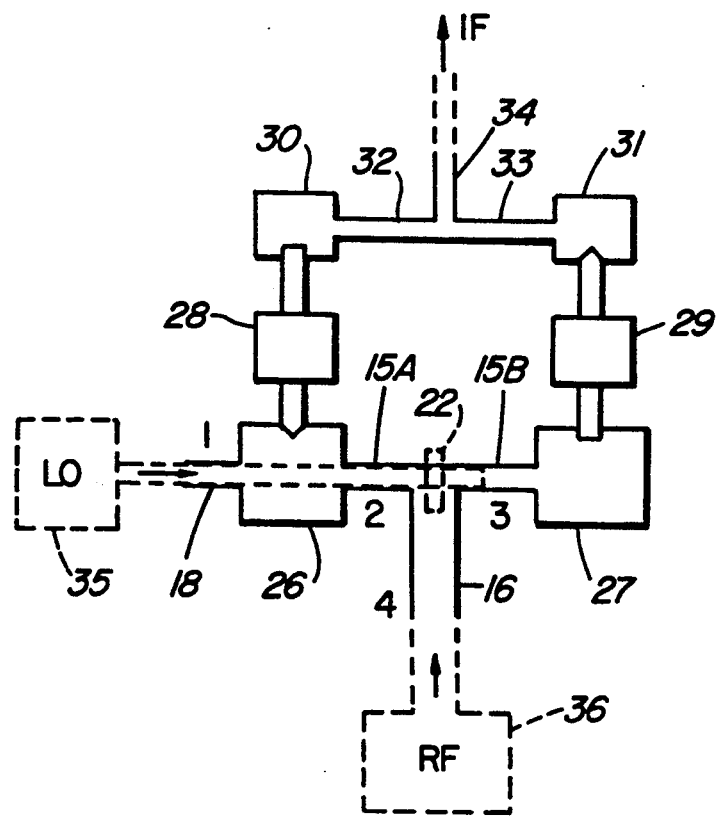
FIG. 11 is a partial view of a microwave integrated circuit showing a Magic-Tee according to the invention as part of a mixer.

The device can be integrated into other microwave circuitry by appropriate connections. In FIG. 11, a Magic-Tee as previously described with reference to FIGS. 1 to 8 is integrated into a microwave integrated circuit mixer. Thus, input matching sections 26 and 27 are attached to ports 2 and 3 i.e. the respective ends of arms 15A and 15B of the Tee. Oppositely-poled beam lead diodes 28 and 29 couple input matching sections 26 and 27, respectively, by way of output matching sections 30 and 31, respectively, to corresponding ends of branch arms 32 and 33 of an output Tee section. The central leg 34 of the output Tee section is the output of the mixer. A local oscillator 35 applies the local oscillator signal (LO) to port 1 and a radio frequency section 36 applies the radio frequency signal (RF) to port 4. The signals couple in the manner described with reference to FIG. 8 to provide the intermediate frequency signal (IF) at the output 34 of the mixer.

The mixer could be implemented as a monolithic microwave integrated circuit device, in which case the beam lead diodes would be formed into the substrate itself.

The Magic-Tee could be integrated in a similar way as part of a feed network of a phased array antenna fabricated using MIC or MMIC technology.

An advantage of embodiments of the present invention is that they can be implemented using multi-level circuit technology thus avoiding the use of directional couplers and phase shifter networks with the concomitant problems of area limitations and relatively high losses when applied to active phase array antenna design.

In tests, embodiments of the present invention performed as well as a waveguide Magic-Tee with respect to phase and amplitude tracking. In addition, they gave several inherent advantages including ease of construction and compatibility with planar microwave circuit technology (i.e. MIC, MMIC). Because they employ microstrip technology and aperture coupling, they have the important advantage of a broad band of frequency of operation.

Another advantage of Magic-Tee devices according to the invention is the high degree of isolation maintained between the feedline port 1 and the Tee leg port 4 which results from the use of aperture-coupling of microstrips using a symmetrical configuration and an aperture which is significantly narrower than the width of the Tee leg.

Microstrip hybrid devices according to the present invention are simple, with few discontinuities, and economical to make. Because of their miniature size, they give good insertion loss, as low as 0.2 dB.

Although embodiments of the invention have been described and illustrated in detail, it is to be clearly understood that they are by way of illustration and example only and not to be taken by way of limitation, the spirit and scope of the present invention being limited only by the appended claims.

We claim:

1. A microwave Magic-Tee circuit arrangement comprising a sandwich arrangement of a conductive ground plane layer and two dielectric layers, each dielectric layer having an innermost surface and an outermost surface, the ground plane layer being sandwiched between respective innermost surface, a microstrip Tee circuit element disposed on the outermost surface of one of the two dielectric layers and a microstrip line conductor disposed on the outermost surface of the other of the two dielectric layers, the microstrip Tee circuit element comprising first, second and third conductors, respectively, joined together to define a junction of the Tee, the first and second conductors comprising respective branch arms of the Tee and the third conductor comprising a Tee leg, said Tee leg being symmetrical about a longitudinal axis thereof and having a width oriented transversely to said longitudinal axis, the circuit arrangement further comprising an aperture disposed within said ground plane layer at a position between said Tee junction and a part of said line conductor, said Tee junction, aperture and part of said line conductor being substantially in register in a direction perpendicular to said layers, said aperture having an axis of symmetry aligned with said longitudinal axis of said Tee leg, the arrangement being such that the Tee junction is aperture-coupled with said part of said line conductor through said aperture.

2. A circuit arrangement as claimed in claim 1, wherein said aperture has an oblong shape and has a width less than the width of said Tee leg.

3. A circuit arrangement as claimed in claim 1, wherein said line conductor is reflectively terminated.

4. A circuit arrangement as claimed in claim 1, wherein one end of said line conductor terminates in an open-circuit at a distance from said axis of symmetry of said aperture equal to about one quarter of a prescribed operating wavelength of the circuit arrangement.

5. A circuit arrangement as claimed in claim 1, wherein respective end portions of said line conductor and at least one of said branch arms are offset from each other.

6. A circuit arrangement as claimed in claim 1, wherein the branch arms are collinear.

7. A planar microwave integrated circuit device comprising a microwave Magic-Tee circuit arrangement comprising a sandwich arrangement of a conductive ground plane layer and two dielectric layers, each dielectric layer having an innermost surface and an outermost surface, the ground plane layer being sandwiched between respective innermost surface, a microstrip Tee circuit element disposed on the outermost surface of one of the two dielectric layers and a microstrip line conductor disposed on the outermost surface of the other of the two dielectric layers, the microstrip Tee circuit element comprising first, second and third conductors, respectively, joined together to define a junction of the Tee, the first and second conductors comprising respective branch arms of the Tee and the third conductor comprising a leg of the Tee, the Tee leg being symmetrical about a longitudinal axis thereof and having a width oriented transversely to said longitudinal axis, the circuit arrangement further comprising an aperture disposed within said ground plane layer at a position between said Tee junction and a part of said line conductor, said Tee junction, aperture and part of said line conductor being substantially in register in a direction perpendicular to said layers, said aperture having an axis of symmetry aligned with said longitudinal axis of said Tee leg, said Tee junction being aperture coupled with said part of the line conductor through said aperture, said microstrip Tee circuit element and said microstrip line conductor being connected to respective microstrip conductors at other parts of said microwave integrated circuit device.

8. An integrated circuit device as claimed in claim 7, wherein the branch arms are collinear.

9. A microwave integrated circuit comprising a multi-layer circuit board having a sandwich arrangement of a conductive ground plane layer and two dielectric layers, each dielectric layer having an innermost surface and an outermost surface, said ground plane being sandwiched between respective innermost surfaces, a microstrip Tee circuit element disposed on the outermost surface of one of the two dielectric layers and a microstrip line conductor disposed on the outermost surface of the other of the two dielectric layers, the microstrip Tee circuit element comprising first and second branch arm conductors, respectively, joined together to define a Tee junction and a Tee leg conductor extending from said Tee junction, said Tee leg being symmetrical about a longitudinal axis thereof and having a width oriented transversely to said longitudinal axis, and an aperture disposed within said ground plane layer at a position between said Tee junction and a part of said line conductor, said Tee junction, aperture and part of said line conductor being substantially in register in a direction perpendicular to said layers, said aperture having an axis of symmetry aligned with said longitudinal axis of said Tee leg, the arrangement being such that the Tee junction is aperture-coupled with said part of said line conductor through said aperture.

10. A microwave integrated circuit as claimed in claim 9, wherein said aperture has an oblong shape and has a width significantly less than the width of said Tee leg conductor.

11. A microwave integrated circuit as claimed in claim 9, where said line conductor is reflectively terminated.

12. A microwave integrated circuit as claimed in claim 11, wherein one end of said line conductor terminates in an open-circuit at a distance from said axis of symmetry of said aperture equal to about one quarter of a prescribed operating wavelength of the circuit arrangement.

13. An integrated circuit as claimed in claim 9, wherein the branch arms are collinear.

14. A microwave integrated circuit comprising a multi-layer circuit board having a sandwich arrangement of a conductive ground plane layer and two dielectric layers, each dielectric layer having an innermost surface and an outermost surface, said ground plane being sandwiched between respective innermost surfaces, two microstrip Tee circuit elements disposed on the outermost surface of one of the two dielectric layers and a microstrip line conductor disposed on the outermost surface of the other of the two dielectric layers, a first one of the two microstrip Tee circuit elements comprising first and second branch arm conductors, respectively, joined together to define a Tee junction and a Tee leg conductor extending from said Tee junction, said Tee leg being symmetrical about a longitudinal axis thereof and having a width oriented transversely to said longitudinal axis, and an aperture disposed within said ground plane layer at a position between said Tee junction and a part of said line conductor, said Tee junction, aperture and part of said line conductor being substantially in register in a direction perpendicular to said layers, said aperture having an axis of symmetry aligned with said longitudinal axis of said Tee leg, said Tee junction being aperture-coupled with said part of said line conductor through said aperture, a pair of oppositely-poled diodes coupling said branch arms of the first one of the two microstrip Tee circuit elements to respective branch arms of the other one of said two microstrip Tee circuit elements, means for applying local oscillator signals to said line conductor and means for applying radio frequency signal to said leg of the first Tee circuit element, the leg of said other of said microstrip Tee circuit elements having a Tee leg comprising an intermediate frequency output port.

15. An integrated circuit as claimed in claim 14, wherein the branch arms of the first of the microstrip Tee circuit elements are collinear.

16. A microwave integrated circuit as claimed in claim 14, wherein the two microstrip Tee circuit elements and the pair of oppositely-poled diodes are provided monolithically on the outermost surface of one of the two dielectric layers.

* * * * *